US010347571B1

(12) United States Patent
Rozbicki et al.

(10) Patent No.: US 10,347,571 B1
(45) Date of Patent: Jul. 9, 2019

(54) INTRA-PACKAGE INTERFERENCE ISOLATION

(71) Applicant: MACOM Technology Solutions Holdings, Inc., Lowell, MA (US)

(72) Inventors: Andrzej Rozbicki, Santa Clara, CA (US); Chi Mo, Irvine, CA (US); Cristiano Bazzani, Irvine, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 15/865,745

(22) Filed: Jan. 9, 2018

(51) Int. Cl.
| | |
|---|---|
| *H01L 23/00* | (2006.01) |
| *H01L 23/31* | (2006.01) |
| *H01L 23/66* | (2006.01) |
| *H01L 23/495* | (2006.01) |
| *H01L 23/498* | (2006.01) |
| *H01L 23/528* | (2006.01) |
| *H01L 23/552* | (2006.01) |

(52) U.S. Cl.
CPC .... *H01L 23/49811* (2013.01); *H01L 23/3121* (2013.01); *H01L 23/4952* (2013.01); *H01L 23/49568* (2013.01); *H01L 23/528* (2013.01); *H01L 23/552* (2013.01); *H01L 24/46* (2013.01); *H01L 24/49* (2013.01); *H01L 23/66* (2013.01); *H01L 2223/6605* (2013.01); *H01L 2223/6644* (2013.01)

(58) Field of Classification Search
CPC ..... H01L 23/528; H01L 23/552; H01L 23/66; H01L 23/49811; H01L 23/49838; H01L 23/5225; H01L 2223/6605; H01L 2223/6644

See application file for complete search history.

(56) References Cited

U.S. PATENT DOCUMENTS

| | | | | |
|---|---|---|---|---|
| 5,309,014 | A * | 5/1994 | Wilson | H01L 23/13 257/584 |
| 5,376,909 | A * | 12/1994 | Nelson | H01L 23/4334 257/664 |
| 2002/0163070 | A1 * | 11/2002 | Choi | H01L 23/3735 257/692 |
| 2016/0112012 | A1 * | 4/2016 | Blednov | H03F 1/0288 455/561 |
| 2017/0055341 | A1 * | 2/2017 | Ma | H03F 3/195 |
| 2017/0125362 | A1 * | 5/2017 | Zhang | H01L 23/49503 |

* cited by examiner

*Primary Examiner* — David A Zarneke
(74) *Attorney, Agent, or Firm* — Thomas Horstemeyer, LLP

(57) ABSTRACT

In one example, a device having integrated package interference isolation includes a ground pad, an integrated circuit device die secured to the ground pad, a substrate secured to the ground pad, at least one a high-frequency, high-power semiconductor device secured to a top mounting surface of the substrate. For electromagnetic isolation, the integrated circuit device die includes a top metal, and the substrate includes a metal via electrically coupled to a metal trace that extends on the top mounting surface of the substrate. The device package also includes a number of ground pad bonding wires that electrically couple the redistribution layer of the integrated circuit device die and the metal trace to the ground pad. The redistribution layer of the integrated circuit device die and the metal trace and via of the substrate help to shield electromagnetic radiation between components in the device package.

7 Claims, 5 Drawing Sheets

INTRA-PACKAGE INTERFERENCE ISOLATION

BACKGROUND

Various types of packages are available for electrical components, such as active and passive semiconductor devices, resistors, capacitors, and inductors, among other components. The packages can secure and protect the components and provide electrically conductive leads or pads to make electrical contacts with the components. Depending upon the style, the packages can be surface mounted, through-hole mounted, or inserted into printed circuit boards, among other mounting techniques. The type, size, lead style, and materials of any given package can be chosen based on the type of components being housed within them, as well as the application for the components. Certain packages can be more or less suitable for high power and/or high frequency components.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
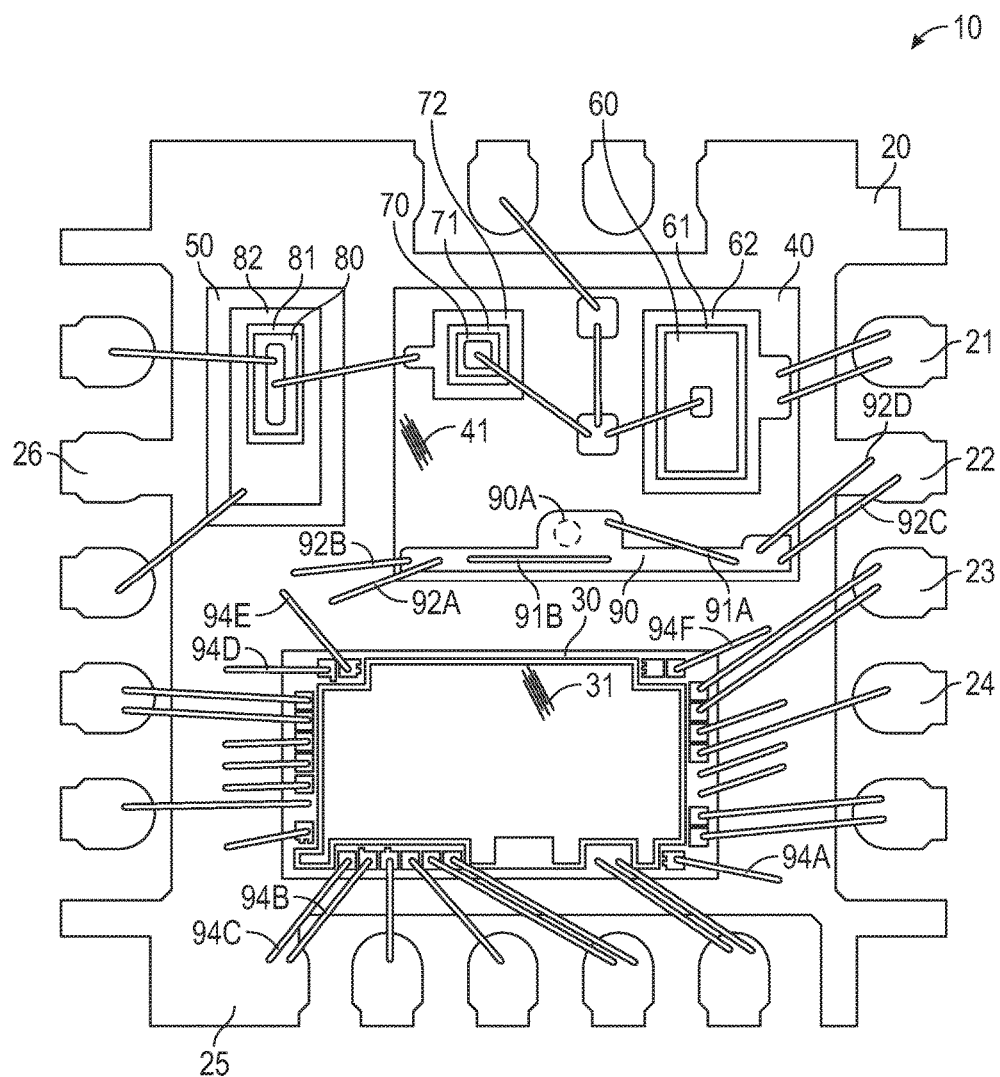
FIG. 1 illustrates a top-down view of an un-encapsulated device according various embodiments described herein.

As noted above, various types of packages are available for electrical components. The type, size, lead style, and materials of any given package can be chosen based on the type of components being housed within them, as well as the application for the components. Certain packages can be more or less suitable for high power and/or high frequency components. For example, flat no-leads packages such as quad-flat no-leads (QFN) or power quad-flat no-leads (PQFN) packages can be used to physically secure and electrically couple semiconductor devices (and potentially semiconductor devices for high-power and high-frequency applications), integrated circuits, and other components to printed circuit boards (PCBs). Flat no-leads packages are one of several types of packages that can be used to connect integrated circuits and other electrical components to PCBs without through holes.

Electromagnetic interference can be a significant concern between components and device packages mounted on PCBs. Electromagnetic interference can also be a concern between components within the same device package. In that context, electromagnetic shielding can be relied upon to reduce electromagnetic interference between components. Electromagnetic shielding can be accomplished using various types of barriers made of conductive materials. Electromagnetic shielding is often achieved through the use of a metallic, conductive enclosure or cage. Such an enclosure can be used to prevent electromagnetic radiation from reaching components or to prevent electromagnetic radiation from propagating away from components. Electromagnetic shielding that blocks radio frequency electromagnetic radiation is also known as radio frequency (RF) shielding. A conductive enclosure used to block electrostatic fields is also known as a Faraday cage. The effectiveness of the shielding depends, among other factors, on the types of conductive material(s) used for the shield, the size and thickness of the shield, the frequency of the fields being shielded, and the shape and orientation of any apertures or openings in the shield.

In the context outlined above, the embodiments described herein are directed to interference isolation in integrated circuit packaging. In one example, a device having integrated package interference isolation includes a ground pad, an integrated circuit device die secured to the ground pad, a substrate secured to the ground pad, at least one a high-frequency, high-power semiconductor device secured to a top mounting surface of the substrate. For electromagnetic isolation, the integrated circuit device die includes a top metal layer, which may be a redistribution layer (RDL), and the substrate includes a metal via electrically coupled to a metal trace that extends on the top mounting surface of the substrate. The device package also includes a number of ground pad bonding wires that electrically couple the top metal layer of the integrated circuit device die and the metal trace to the ground pad. The top metal layer of the integrated circuit device die and the metal trace and via of the substrate help to shield electromagnetic radiation between the high-frequency, high-power semiconductor device(s) and the integrated circuit device die in the device package.

Figure 2:
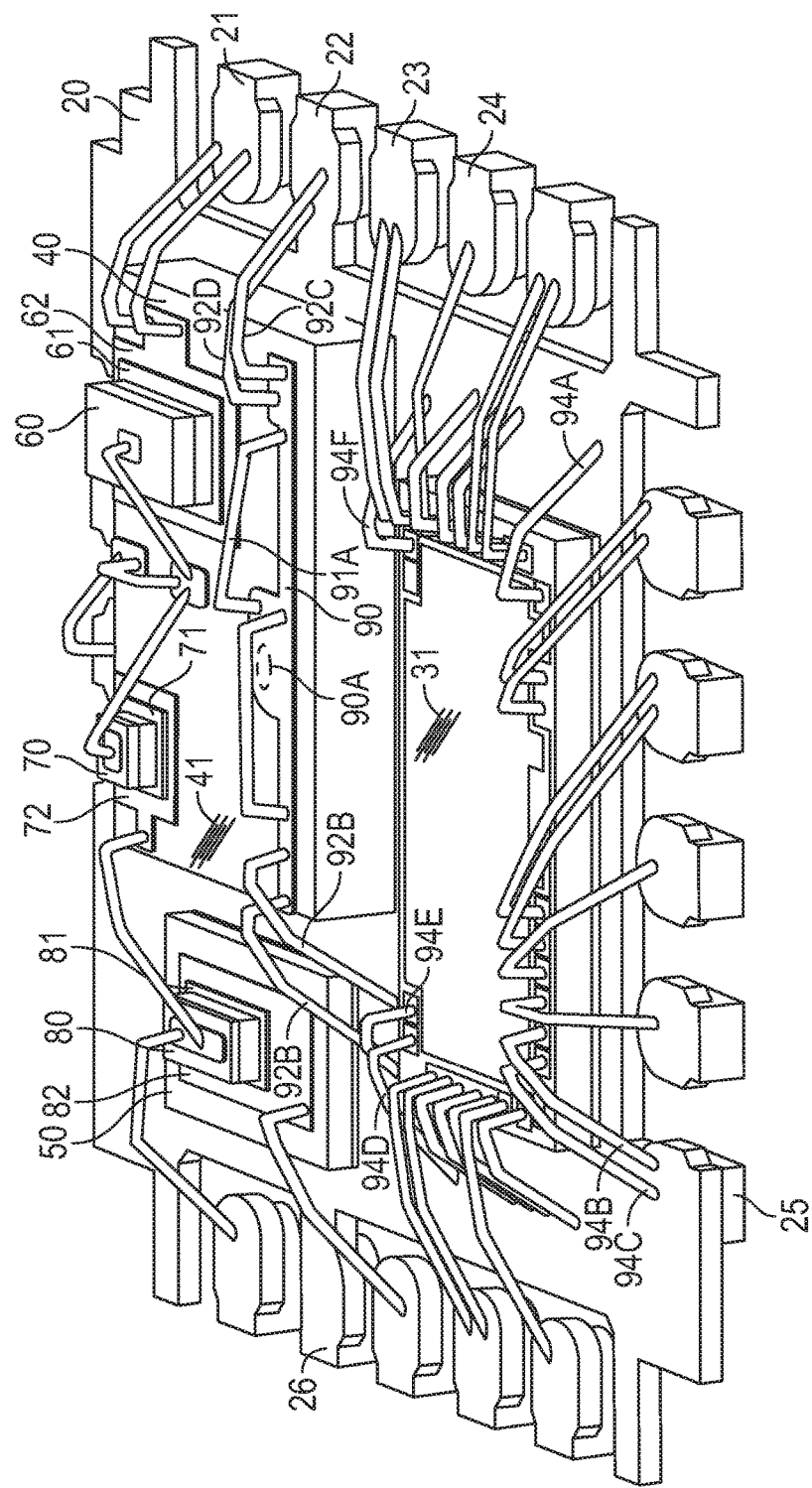
FIG. 2 illustrates a top perspective view of the device shown in FIG. 1 according various embodiments described herein.
Figure 3:
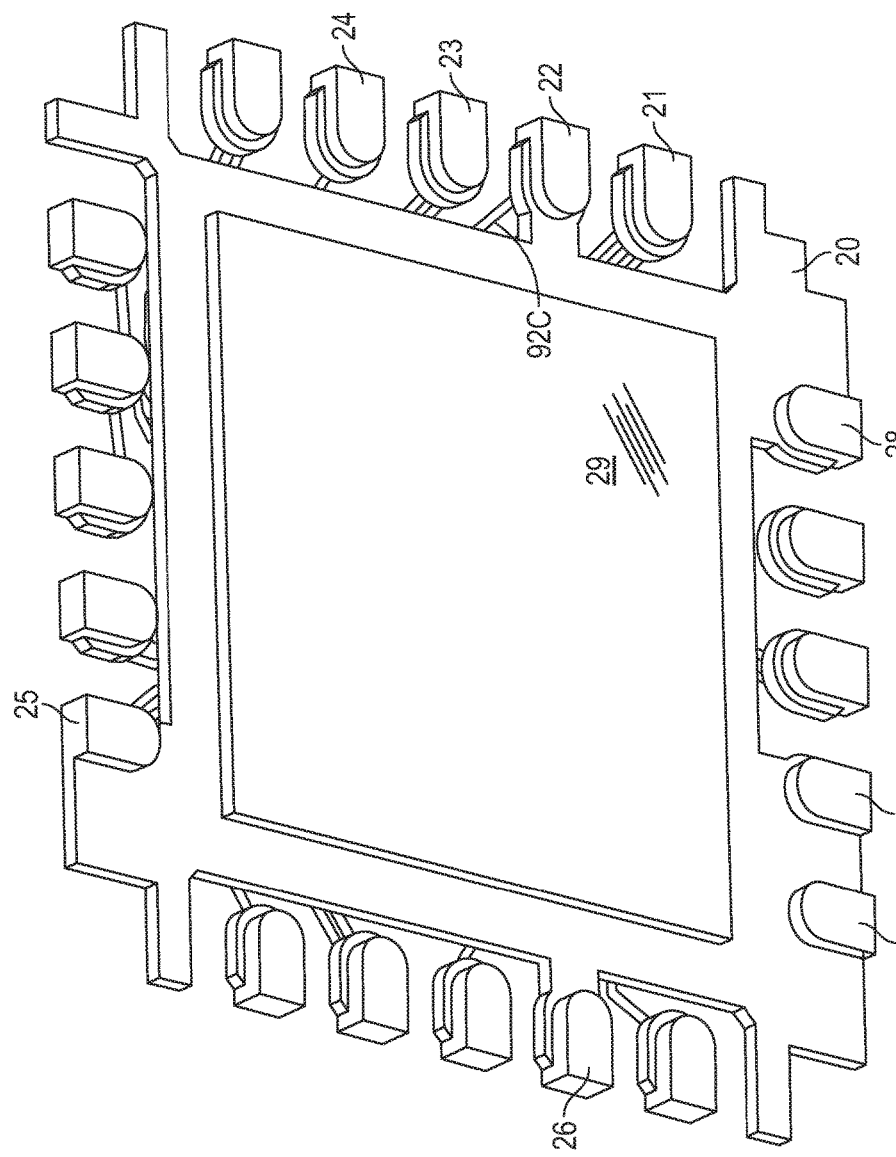
FIG. 3 illustrates a top perspective view of the device shown in FIG. 1 according various embodiments described herein.

Turning to the drawings, FIG. 1 illustrates a top-down view of an un-encapsulated device 10 according various embodiments described herein, FIG. 2 illustrates a top perspective view of the device 10, and FIG. 3 illustrates a bottom perspective view of the device 10. Before turning to specific aspects of the device 10, it is noted that the embodiment shown in FIGS. 1-3 is provided by way of example only. The embodiment is not drawn to scale, and the concepts described herein can be applied to other styles and sizes of packages. Thus, although the package of the device 10 is representative of a PQFN style package, the concepts described herein can be applied to other styles and sizes of packages. Additionally, although FIGS. 1-3 illustrate a certain arrangement of diodes and integrated circuits in a package, the concepts of intra-package interference isolation described herein can be applied for use with other semiconductor devices, including devices that operate at relatively high frequencies.

The device 10 is un-encapsulated as shown. In various embodiments, the materials used to encapsulate the device 10 can include any suitable material(s), such as ceramic, plastic, epoxy, liquid crystal polymer (LCP), silicone, or polymide resins or blends, with or without glass, carbon, or other reinforcements, among other materials. The encapsulating material(s) can be selected to provide adequate protection (e.g., an adequate level of temperature sensitivity, vibration sensitivity, moisture sensitivity, or other sensitivity level etc.) for the components within the device 10, mechanical strength, adequate matching of the thermal expansion to other materials in the package, and other relevant factors.

As best shown in FIGS. 1 and 2, the device 10 includes a ground pad 20, a number of device contacts or leads 21-28, an integrated circuit device die 30, a first substrate 40, and a second substrate 50. The integrated circuit device die 30, first substrate 40, and second substrate 50 are each secured or mounted to the ground pad 20 as described in further detail below. The device 10 also includes a number of semiconductor devices, including the diodes 60, 70, and 80. As shown, the diodes 60 and 70 are secured or mounted on the first substrate 40, and the diode 80 is secured or mounted on the second substrate 50.

The ground pad 20 can be embodied as a metal pad or slug. The ground pad 20 can be formed from copper, aluminum, tin, silver, gold, zinc, other metals, diamond, graphite, or suitable materials or compositions thereof. The ground pad 20 can also be coated or plated with a material, such as gold, silver, copper, nickel, palladium, etc., which can improve the mechanical and/or electrical performance of the ground pad 20 or assist in the adhesion of other components to the ground pad 20. When formed from an electrically conductive material and/or coating, such as copper, the ground pad 20 can act both as an electrical contact and as a heatsink. In some cases, the bottom surface 29 (FIG. 3) of the ground pad 20 can be relied upon to conduct heat away from the components in the device 10. As best shown in FIG. 3, the ground pad 20 can extend to and be electrically integrated with certain leads of the device 10, such as the device leads 22 and 24-28 as shown.

Referring between FIGS. 1 and 2, the first substrate 40 and the second substrate 50 can be secured to the ground pad 20 using an epoxy, such as a dielectric epoxy. The integrated circuit device die 30 can also be secured to the ground pad 20 using a dielectric epoxy. Further, the diode 60 can be secured to a metal pad 62 using a silver epoxy 61, the diode 70 can be secured to a metal pad 72 using a silver epoxy 71, and the diode 80 can also be secured to a metal pad 82 using a silver epoxy 81.

The first substrate 40 and the second substrate 50 can be embodied as aluminum nitride (AlN) substrates in one example. AlN substrates have relatively high thermal conductivity and resistivity. In operation, the diodes 60, 70, and 80 can generate a significant amount of heat, and the substrates 40 and 50 can help to draw the heat away from the diodes 60, 70, and 80 while electrically insulating them from the ground pad 20. In other cases, the substrates 40 and 50 can be embodied as substrates formed from other suitable materials.

The integrated circuit device die 30 can be embodied as an integrated bias controller to control the voltage applied to the diodes 60, 70, and 80. As one example, the diodes 60, 70, and 80 can be embodied as PIN diodes of a single-pole, dual-throw (SPDT) transmit/receive (TX/RX) switch suitable for time division duplex (TDD) long term evolution (LTE) communications. Thus, the diodes 60, 70, and 80 can be embodied as high-frequency, high-power semiconductor devices. A number of bonding pads of the integrated circuit device die 30 are electrically coupled to various device leads of the device 10 using bonding wires as shown in FIGS. 1 and 2, although a number of the bonding wires are not individually referenced. A number of bonding wires are also used to electrically couple the diodes 60, 70, and 80 into configuration for the SPDT TX/RX switch, and those bonding wires are also shown in FIGS. 1 and 2.

As described herein, the concepts of interference isolation in the device 10 can be relied upon to capture, reduce, or isolate (e.g., to a beneficial or suitable extent) at least some of the high frequency electromagnetic energy that radiates from the diodes 60, 70, and 80. By reducing the high frequency electromagnetic energy, the interference isolation can help to ensure the functionality of the device die 30 or, in extreme cases, avoid damage to the integrated circuit device die 30. Without interference isolation, electromagnetic energy radiating from the diodes 60, 70, and 80 can induce ripple voltages on metal traces, pads, vias, pins, etc. of the integrated circuit device die 30. These ripple voltages can lead to failures and malfunctions on the integrated circuit device die 30 if they become too large. Beyond the integrated circuit device die 30 and the diodes 60, 70, and 80, the concepts of interference isolation described herein can be applied to other devices having other types and combinations of integrated and discrete semiconductor devices.

In the example shown, the interference isolation in the device 10 is provided through a combination of a metal trace 90 that extends on a top surface 41 of the substrate 40, isolation bonding wires 91A and 91B, and a metal via 90A that is electrically coupled to the metal trace 90 and extends through the substrate 40. The metal trace 90 can be formed to any suitable size, shape, and thickness on the top surface 41 of the substrate 40 through any suitable manufacturing processes, such as deposition or other processes. Variations on the size and shape of metal traces similar to the metal trace 90, for the purpose of interference isolation, are described with reference to FIG. 5 below.

The metal trace 90 is electrically coupled to the ground pad 20 through the bonding wires 92A-92D, which can be installed with any suitable wire bonding machine. The bonding wires 92A-92D can be embodied as gold, copper, aluminum, or silver wires, among other suitable types of metal or metal alloys. The bonding wires 92A-92D can be any suitable diameter in thickness and attached using any suitable technique, such as ball, wedge, or compliant bonding, among other techniques.

The isolation bonding wires 91A and 91B can be similar to the bonding wires 92A-92D, but are electrically coupled at both ends to different locations on the top of the metal trace 90 as shown in FIGS. 1 and 2. As best shown in FIG. 2, the isolation bonding wires 91A and 91B extend over and along the metal trace 90 between the diodes 60 and 70 and the integrated circuit device die 30. Along with the other interference isolation metal traces, vias, and bonding wires described herein, the isolation bonding wires 91A and 91B act as a type of Faraday cage or shield to block electromagnetic radiation. Other variations on the number and placement of isolation bonding wires, for the purpose of interference isolation, are described with reference to FIG. 5 below.

As noted above, the first substrate 40 can be secured to the ground pad 20 using dielectric epoxy. Alternatively, the first substrate 40 can be secured to the ground pad 20 using a conductive-type epoxy, such as silver epoxy. In that case, the conductive-type epoxy can help provide an additional conductive pathway between the metal trace 90 and the ground pad 20 through the metal via 90A. The metal via 90A is described in further detail below with reference to FIG. 4.

The interference isolation in the device 10 is also provided through a top metal layer 31 of the integrated circuit device die 30. The top metal layer 31 can be the top layer of metal used in any multi-metal or other semiconductor manufacturing process, such as an RDL or similar top layer of metal. The top metal layer 31 can be electrically coupled through in-die metal vias and metal traces to grounding nodes in the integrated circuit device die 30. The top metal layer 31 can also be electrically coupled to a number of ground bonding pads of the integrated circuit device die 30, shown close to the corners of the integrated circuit device die 30. The ground bonding pads of the integrated circuit device die 30 are electrically coupled to the ground pad 20 through the bonding wires 94A-94F as shown in FIGS. 1 and 2. Additionally or alternatively, other layers of metal in the device 10 can be electrically coupled to ground bonding pads of the integrated circuit device die 30 and/or to the ground pad 20.

Figure 4:
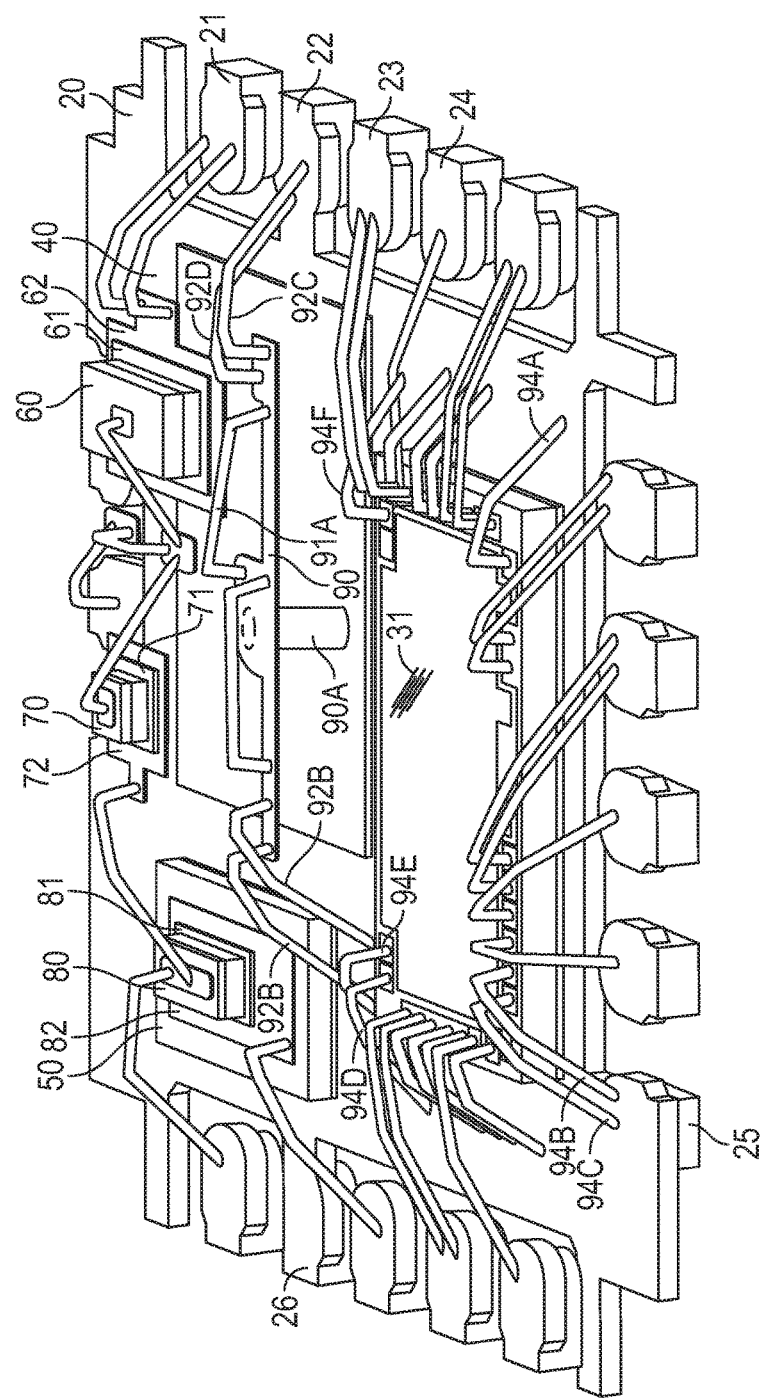
FIG. 4 illustrates a top perspective view of the device shown in FIG. 1 with a substrate removed from view according various embodiments described herein.

FIG. 4 illustrates a top perspective view of the device 10 shown in FIG. 1 with the substrate 40 removed from view. Particularly, the substrate 40 is removed so that the metal via 90A can be more clearly seen. The metal via 90A is electrically coupled to the metal trace 90 and extends through from the top surface 41 (FIG. 1) of the substrate 40 to the bottom surface of the substrate 40. Again, the first substrate 40 can be secured to the ground pad 20 using dielectric epoxy. Alternatively, the first substrate 40 can be secured to the ground pad 20 using a conductive-type epoxy, such as silver epoxy. In that case, the conductive-type epoxy can help provide an additional conductive pathway between the metal trace 90 and the ground pad 20 through the metal via 90A.

Turning to variations on the examples described above, FIG. 5 illustrates an example substrate 100 with example metal traces 110 and 111, vias 110A-110F and 111A-111F, and isolation bonding wires 120A-120B, 121A-121B, and 130-132. The substrate 100 is similar to the substrate 40 shown in FIGS. 1 and 2, and various components can be mounted to the top surface 101 of the substrate 100 within the central region 102, similar to the way that the diodes 60 and 70 are shown as being mounted to the substrate 40 in FIGS. 1 and 2. In that context, the substrate 100 includes the region 102 for mounting components in a packaged device.

Figure 5:
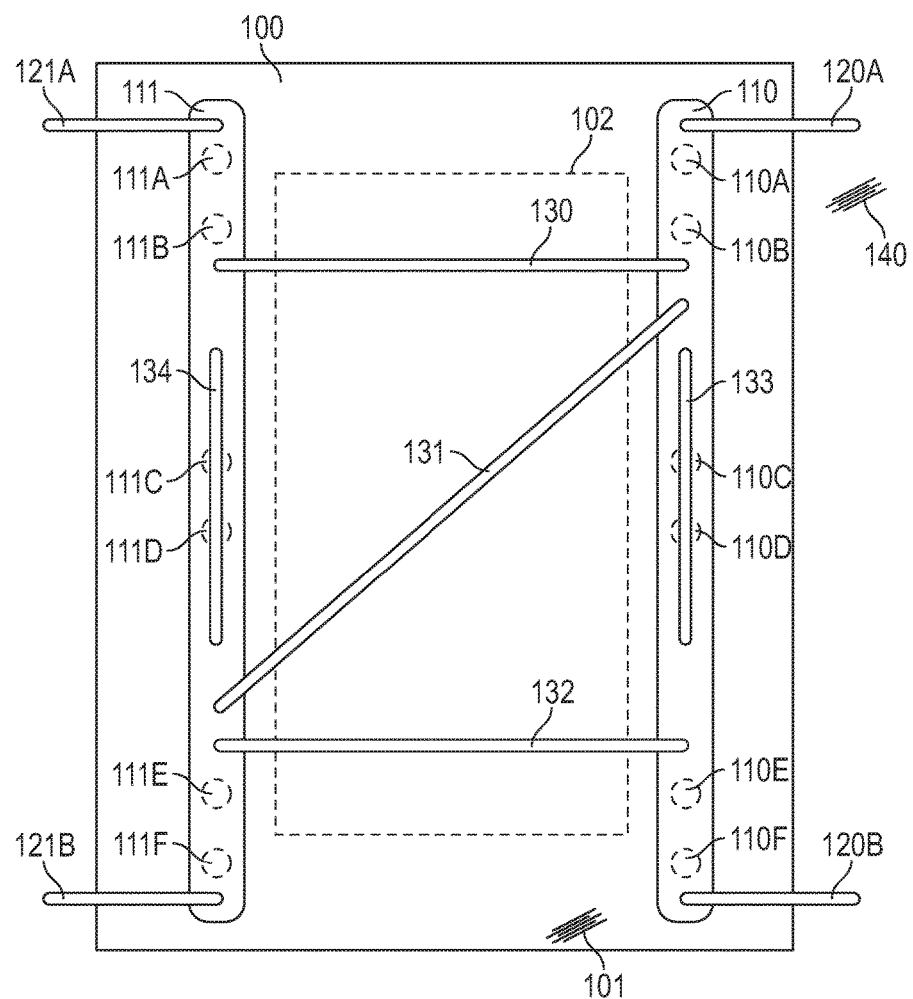
FIG. 5 illustrates an example substrate with example metal traces, vias, and isolation bonding wires according various embodiments described herein.

Rather than including a single metal trace, however, the substrate 100 includes two metal traces 110 and 111 formed on its top surface 101. The metal traces 110 and 111 are shown in FIG. 5 as being formed along the two longer, longitudinal sides of the substrate 100, and additional or alternative metal traces could be formed along the two shorter sides of the substrate 100 in other examples. In one case, a metal trace similar to the metal traces 110 and 111 could extend continuously around the outer peripheral edge of the substrate 100.

Further, rather than including a single metal via, the substrate 100 includes vias 110A-110F and 111A-111F. Each of the vias 110A-110F is electrically coupled to the metal trace 110 and extends through the substrate 100, and each of the vias 111A-111F is electrically coupled to the metal trace 111 and extends through the substrate 100.

The metal trace 110 can be electrically coupled to a top surface 140 of a ground pad (e.g., similar to the ground pad 20 shown in FIGS. 1 and 2) through the bonding wires 120A and 120B, which can be installed with any suitable wire bonding machine. Similarly, the metal trace 111 can be electrically coupled to the top surface 140 of a ground pad (e.g., similar to the ground pad 20 shown in FIGS. 1 and 2) through the bonding wires 121A and 121B, which can be installed with any suitable wire bonding machine. Alternatively, the metal traces 110 and 111 can be electrically coupled directly to one or more ground package leads of a package using bonding wires, rather than to a ground pad of the package. The bonding wires 120A-120B and 121A-121B can be embodied as gold, copper, aluminum, or silver wires, among other suitable types of metal or metal alloys, and can be any suitable diameter in thickness.

The metal traces 110 and 111 can also be electrically coupled together through the isolation bonding wires 130-132, which can also be installed with any suitable wire bonding machine. The isolation bonding wires 130-132 can, in some cases, extend up and over components mounted within the central region 102. The isolation bonding wires 130-132 can also, in some cases, extend over any bonding wires used to electrically couple together the components mounted within the central region 102.

An additional isolation bonding wire 133 can be electrically coupled at both ends to different locations on the top of the metal trace 110 as shown in FIG. 5. The isolation bonding wire 133 extends over and along the metal trace 110. Further, an additional isolation bonding wire 134 can be electrically coupled at both ends to different locations on the top of the metal trace 111. The isolation bonding wire 134 extends over and along the metal trace 111.

The interference isolation metal traces 110 and 110, vias 110A-110F and 111A-111F, and isolation bonding wires 120A-120B, 121A-121B, and 130-132 can act as a type of Faraday cage or shield to block electromagnetic radiation that may radiate away from components mounted within the central region 102 according to the concepts described herein. Variations on the number and placement of the metal traces 110 and 110, vias 110A-110F and 111A-111F, and isolation bonding wires 120A-120B, 121A-121B, and 130-132 are within the scope of the embodiments. For example, fewer or additional metal traces 110 and 111, vias 110A-110F and 111A-111F, and isolation bonding wires 120A-120B, 121A-121B, and 130-132 can be relied upon depending, for example, upon the number, size, placement, and interconnections between the components mounted within the central region 102. Additionally, the size, length, and orientation of the metal traces 110 and 110, vias 110A-110F and 111A-111F, and isolation bonding wires 120A-120B, 121A-121B, and 130-132 can vary as compared to that shown in FIG. 5 based on similar or related factors.

The concepts described herein can be relied upon to reduce electromagnetic interference between components in device packages. The concepts provide electromagnetic shielding to reduce electromagnetic interference between components. The metal trace, via, and isolation bonding wire structures described herein provide a structural arrangement similar to an enclosure, and help to prevent electromagnetic radiation from propagating among components in a device package, similar to a Faraday cage. The effectiveness of the shielding depends, among other factors, on the number, position, orientation, size, thickness, etc., of each of the metal traces, vias, and isolation bonding wire structures used.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A device having integrated package interference isolation, comprising:

a ground pad;

an integrated circuit device die secured to the ground pad, the integrated circuit device die comprising a top metal redistribution layer;

a substrate secured to the ground pad, the substrate comprising a via that extends from a top surface through to a bottom surface of the substrate, the substrate further comprising a metal trace that extends a length along the top surface of the substrate, the via being electrically coupled to the metal trace;

a high-frequency, high-power semiconductor device secured to the top surface of the substrate; and a number of ground pad bonding wires that electrically couple the top metal redistribution layer and the metal trace to the ground pad.

2. The device of claim 1, further comprising a number of isolation bonding wires electrically coupled to the metal trace.

3. The device of claim 2, wherein each end of each of the number of isolation bonding wires is electrically coupled to the metal trace at a respective location on the metal trace.

4. The device of claim 1, wherein metal via extends from the metal trace on the top surface of the substrate into the substrate.

5. The device of claim 1, wherein the top metal redistribution layer substantially covers a top surface of the integrated circuit device die.

6. The device of claim 1, wherein, in the device, the metal traceis positioned to extend between the high-frequency, high-power semiconductor device and the integrated circuit device die.

7. The device of claim 1, wherein the ground pad extends to a plurality of ground leads of the device.

* * * * *